(12) United States Patent
Chen et al.

(10) Patent No.: US 7,770,289 B2
(45) Date of Patent: Aug. 10, 2010

(54) TOOL FOR SEMICONDUCTOR PACKAGE

(75) Inventors: Ming-Yue Chen, Tu-Cheng (TW); Chun-Fu Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/904,517

(22) Filed: Sep. 26, 2007

(65) Prior Publication Data

US 2008/0072419 A1     Mar. 27, 2008

(30) Foreign Application Priority Data

Sep. 26, 2006    (CN)    .................. 2006 1 0096201

(51) Int. Cl.
*H05K 13/04* (2006.01)

(52) U.S. Cl. .............. 29/754; 29/758; 29/854; 439/73

(58) Field of Classification Search ............ 29/729, 29/739–743, 758, 764, 761–762, 832, 260–262, 29/266; 439/331, 73, 68, 71; 438/15, 18; 257/727, 733, 778; 324/754, 755
See application file for complete search history.

(56) References Cited

U.S. PATENT DOCUMENTS

| | | | | |
|---|---|---|---|---|
| 4,507,861 A | * | 4/1985 | Sprenkle | 29/741 |
| 4,800,647 A | * | 1/1989 | Guyer | 29/741 |
| 5,230,143 A | * | 7/1993 | Karlovich | 29/764 |
| 5,451,165 A | * | 9/1995 | Cearley-Cabbiness et al. | 439/71 |
| 5,770,891 A | * | 6/1998 | Frankeny et al. | 257/727 |
| 5,842,261 A | * | 12/1998 | Ortiz | 29/426.5 |
| 6,285,202 B1 | * | 9/2001 | Hembree | 324/755 |
| 6,353,329 B1 | * | 3/2002 | Kiffe | 324/760 |
| 7,225,531 B2 | * | 6/2007 | Hwang | 29/739 |
| 7,350,290 B2 | * | 4/2008 | Goodman et al. | 29/764 |
| 2004/0112142 A1 | | 6/2004 | Min et al. | |

FOREIGN PATENT DOCUMENTS

TW         309248        4/2007

* cited by examiner

*Primary Examiner*—Minh Trinh
(74) *Attorney, Agent, or Firm*—Andrew C. Cheng; Wei Te Chung; Ming Chieh Chang (57) ABSTRACT

A tool for making the semiconductor package accurately contact with the terminals of a electrical connector, comprises a body with a through hole for passing through the semiconductor package thereof, a plurality of the latching members mounted on the body and a guiding member, the guiding member is received in the body and could move up and down relative to the body. The guiding member of the invention is a floatable model to decrease the damage of the semiconductor package while loading.

3 Claims, 11 Drawing Sheets

FIG. 11

TOOL FOR SEMICONDUCTOR PACKAGE

BACKGROUND OF THE INVENTION

1. Field of the Invention

The present invention relates to a tool for loading a semiconductor package, and more particularly to a tool for making the semiconductor package accurately contact with terminals of an electrical connector.

2. Description of the Related Art

Figure 1:
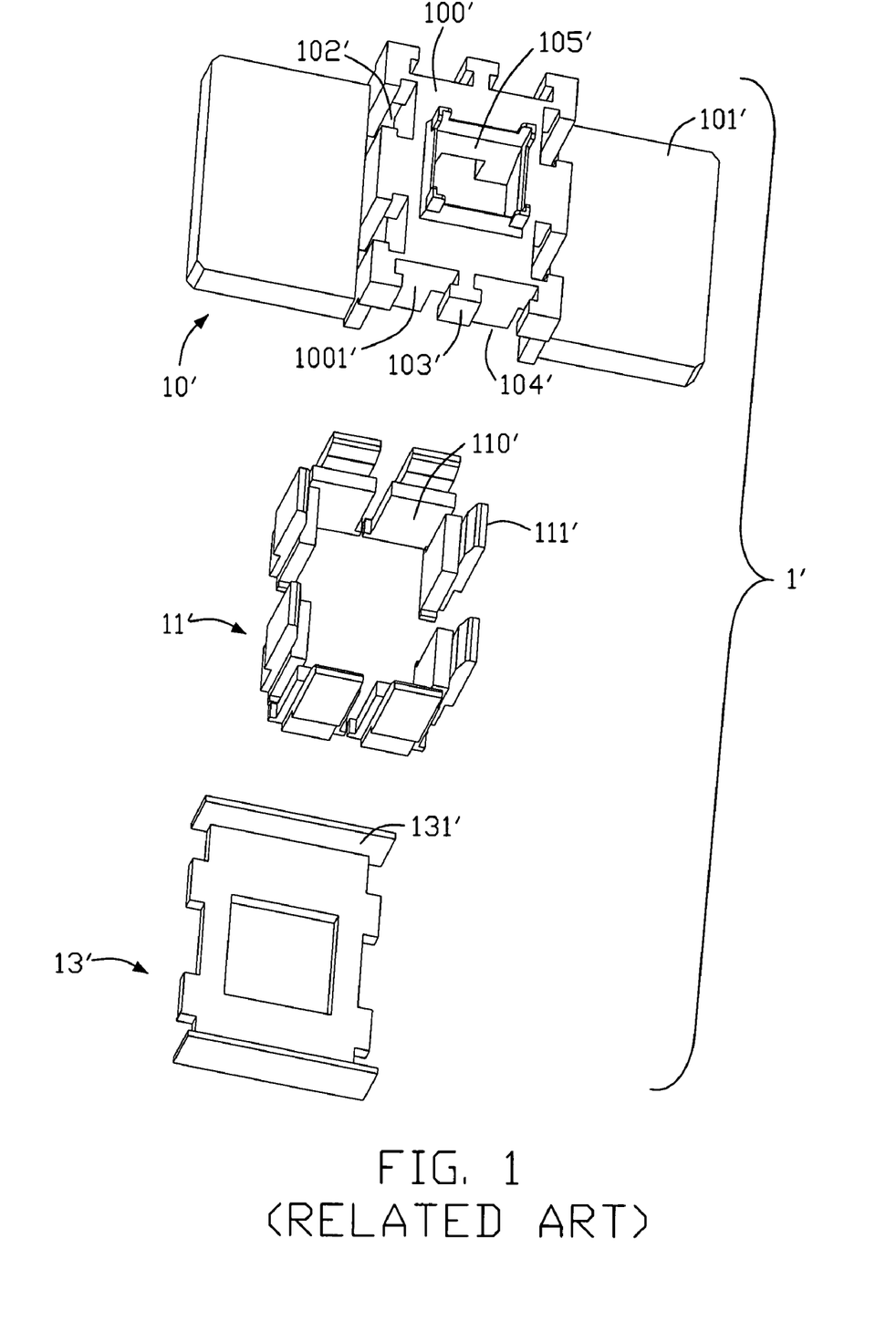
FIG. 1 is an exploded, perspective view of a tool of the related art.
Figure 2:
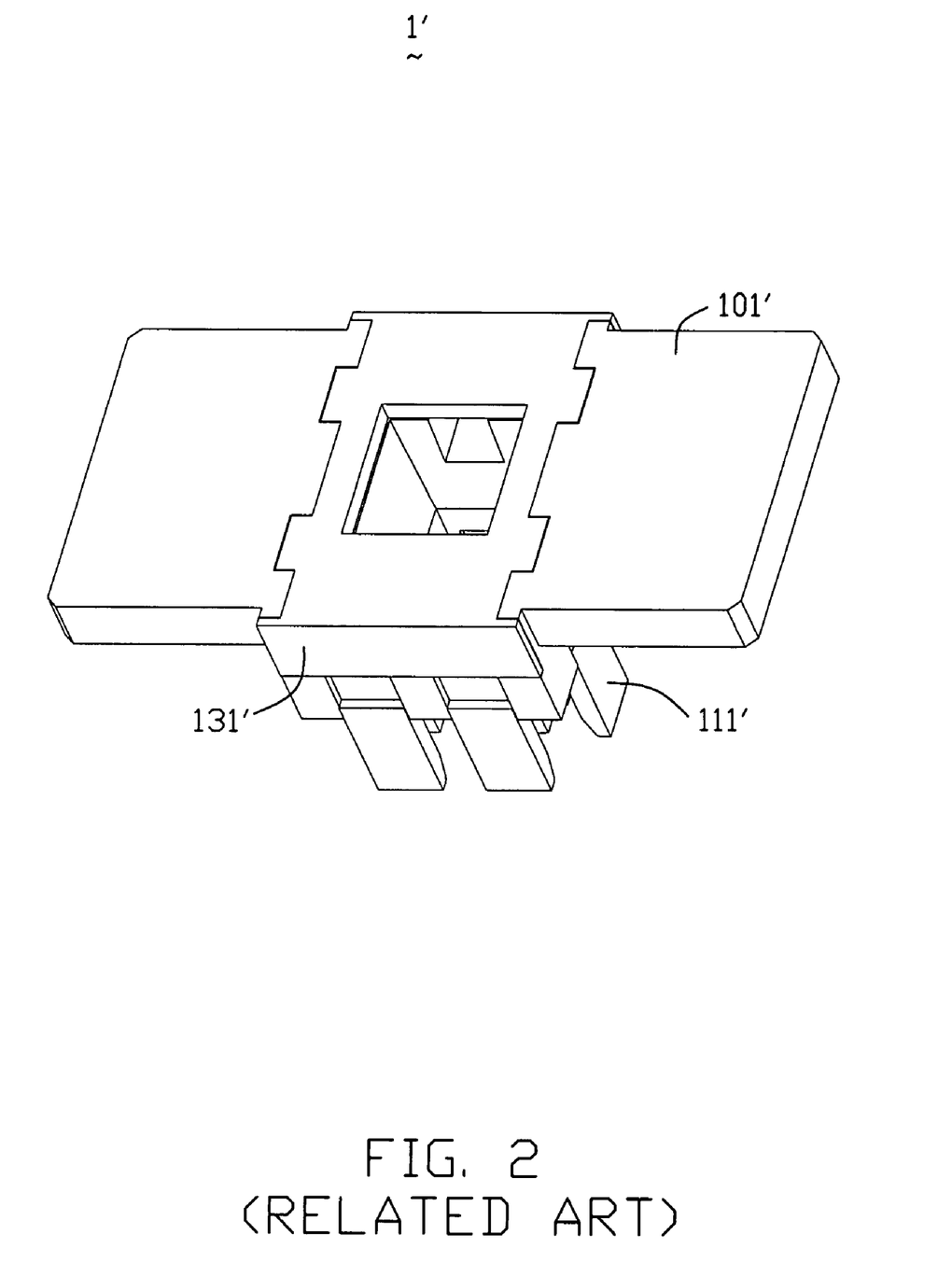
FIG. 2 is an assembled, perspective view of the tool of FIG. 1.

FIG. 1 and FIG. 2 disclose a tool 1' for loading a semiconductor package. Said tool 1' comprises a body 10', a plurality of latching members 11' mounted on the body 10' and a backboard 13' retained to the body 10'.

The body 10' has a main body 100' with a center hole (not labeled) thereof comprising a pair of sidewalls 1001' and a pair of board-like members 101' disposed on opposite sides of the main body 100'. The main body 100' has a casing 105' in a funnelform shape extending from one end of the center hole, the smallest section of the casing 105' has the same size with the semiconductor package (not shown). A plurality of grooves 102' are defined at a connection portion of the main body 100' and board-like member 101', a plurality of projections 103' are disposed on the sidewalls 1001' symmetrically, two adjacent projections 103' defining a flute 104' therebetween. The latching members 11' are divided into first latching members and second latching members, each comprising a longitudinal retaining portion 110' and a latching portion 111' extending from a center part of the retaining portion 110' along a longitudinal direction, wherein the first latching member is retained to the through groove 102', the second latching member is retained to the flute 104'. The backboard 13' retains to the body 10', and the arms 131' of the backboard 13' retain to the sides of the body 10'. The semiconductor package can enter the electrical connector (not labeled) along the casing 105' and electrically contact with the terminals of the electrical connector accurately.

The tool said above has following disadvantages: when loading the semiconductor package, the tool makes the semiconductor package place on the area of the casing to be convenient for vacuum sucker sucking the semiconductor package out, while the semiconductor package would move away the right position when receiving outside force accidentally in the process of loading, so at least part of the semiconductor package would depart from the area restricted by the casing, and the semiconductor package may be damaged by the casing obviously.

SUMMARY OF THE INVENTION

An object of the invention is to provide a tool for helping an electrical connector adapt for the different sizes of semiconductor packages.

Another object of the invention is to provide a tool with a floatable guiding member retaining the semiconductor package.

To achieve the above-mentioned objects, a tool for making the semiconductor package accurately contact with terminals of an electrical connector comprises a body, a plurality of latching members mounted on the body and a guiding member received in the body. The guiding member could move longitudinally relative to the body.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Referring to FIGS. 3 to 11, a tool 1 used for a semiconductor package 4 in different sizes electrically contacting with terminals (not shown) accurately of an electrical connector 2 suckable by a vacuum sucker 3 are disclosed.

Figure 7:
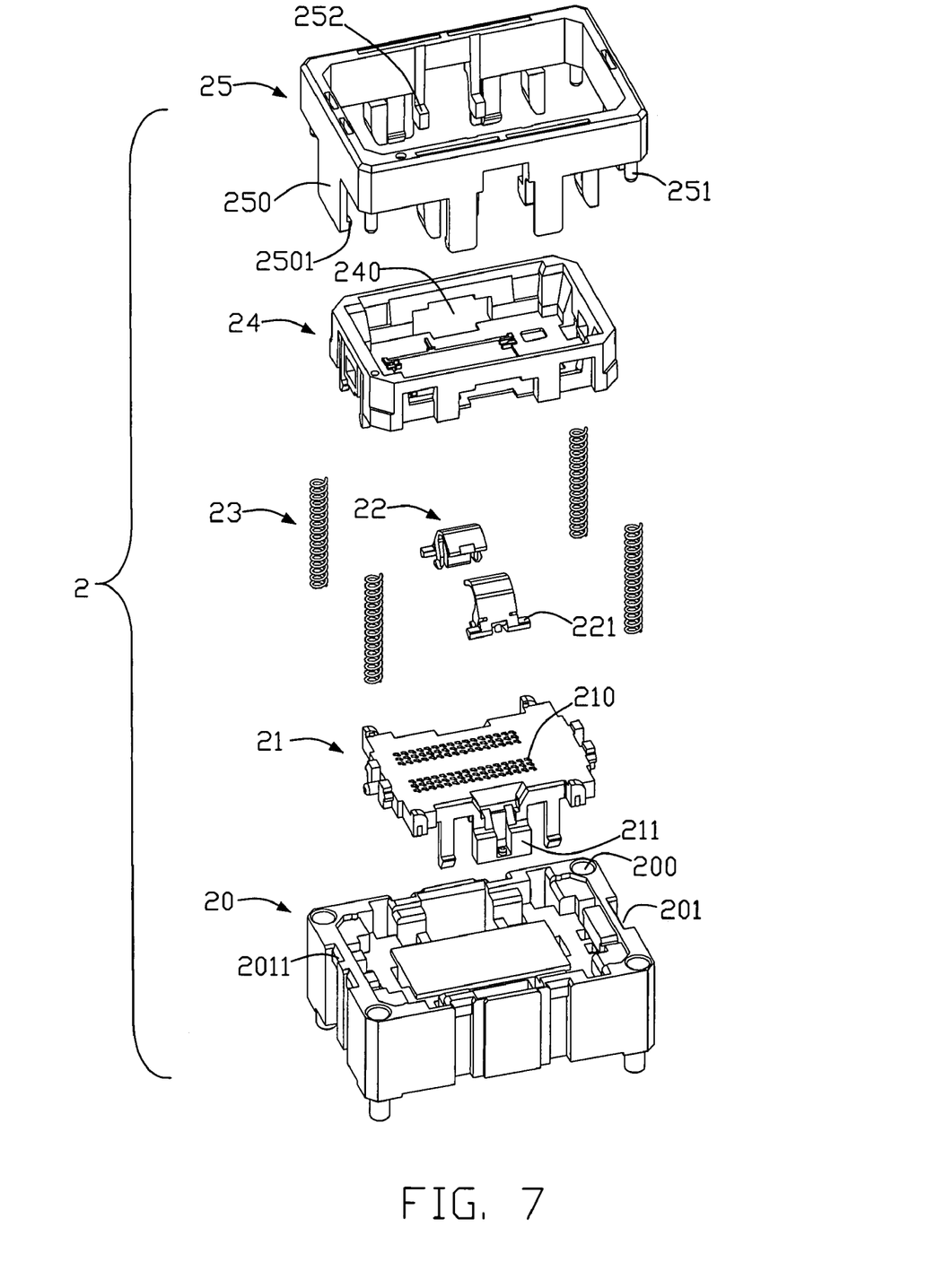
FIG. 7 is an exploded, perspective view of an electrical connector which may use the tool.
Figure 8:
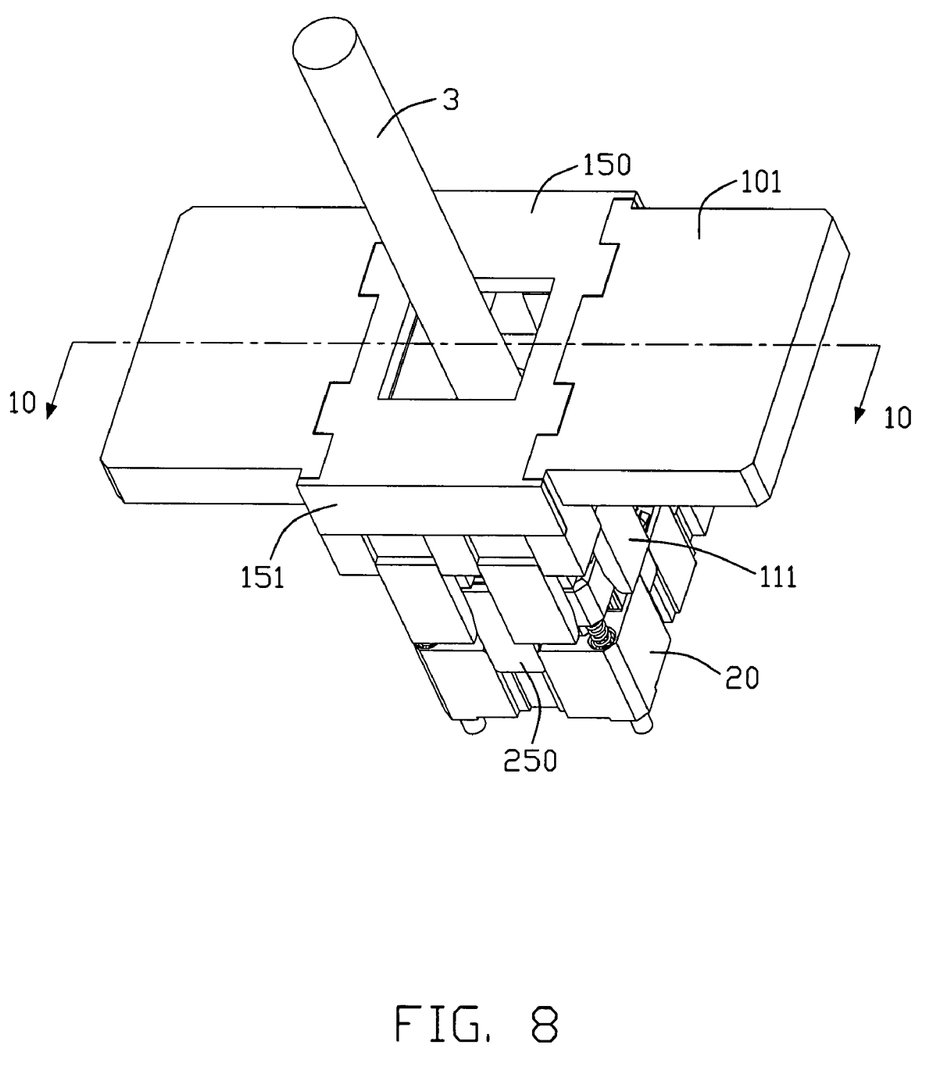
FIG. 8 is a perspective view of the tool mounted to the electrical connector; wherein a locking member of the electrical connector is in a close state.
Figure 9:
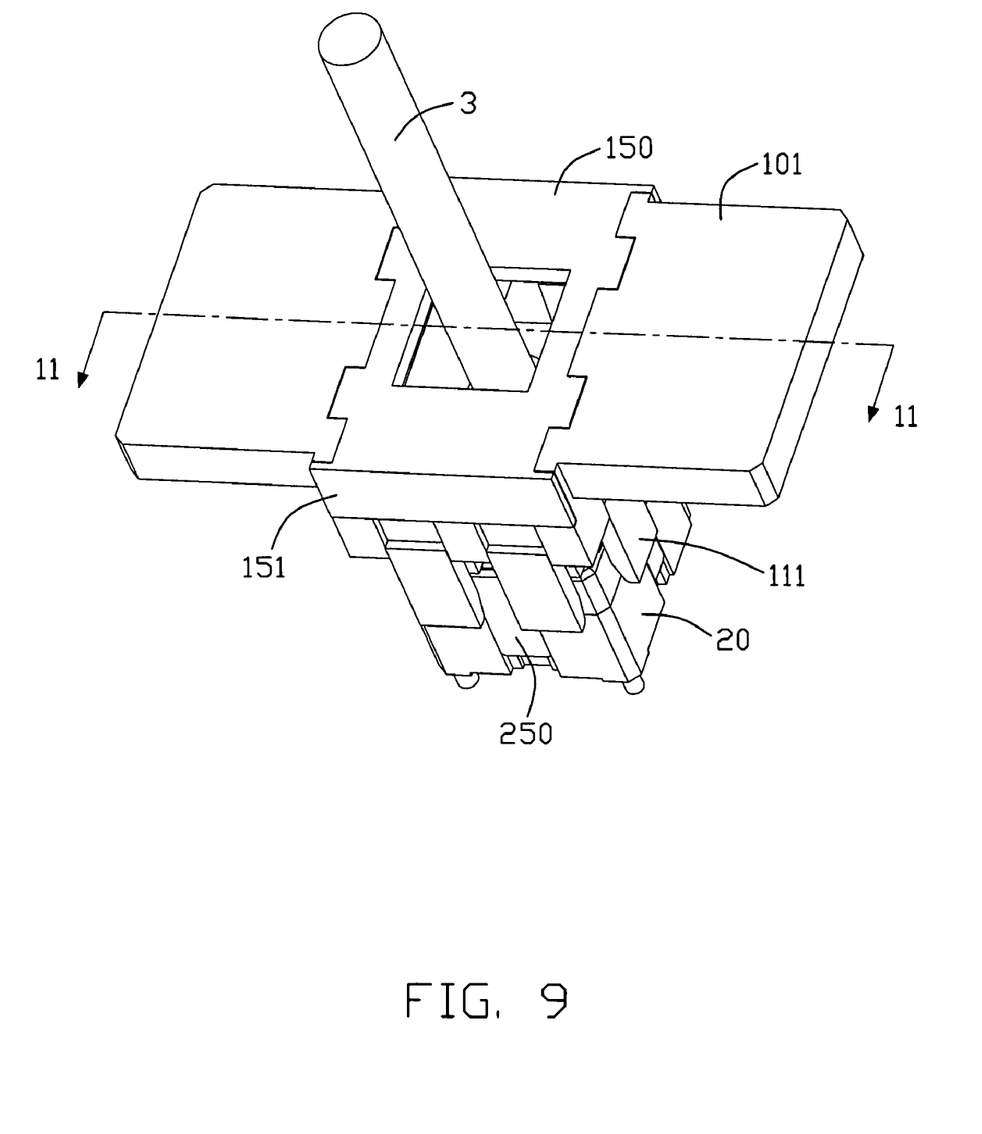
FIG. 9 is similar to FIG. 8, except that the locking member is in an open state.
Figure 10:
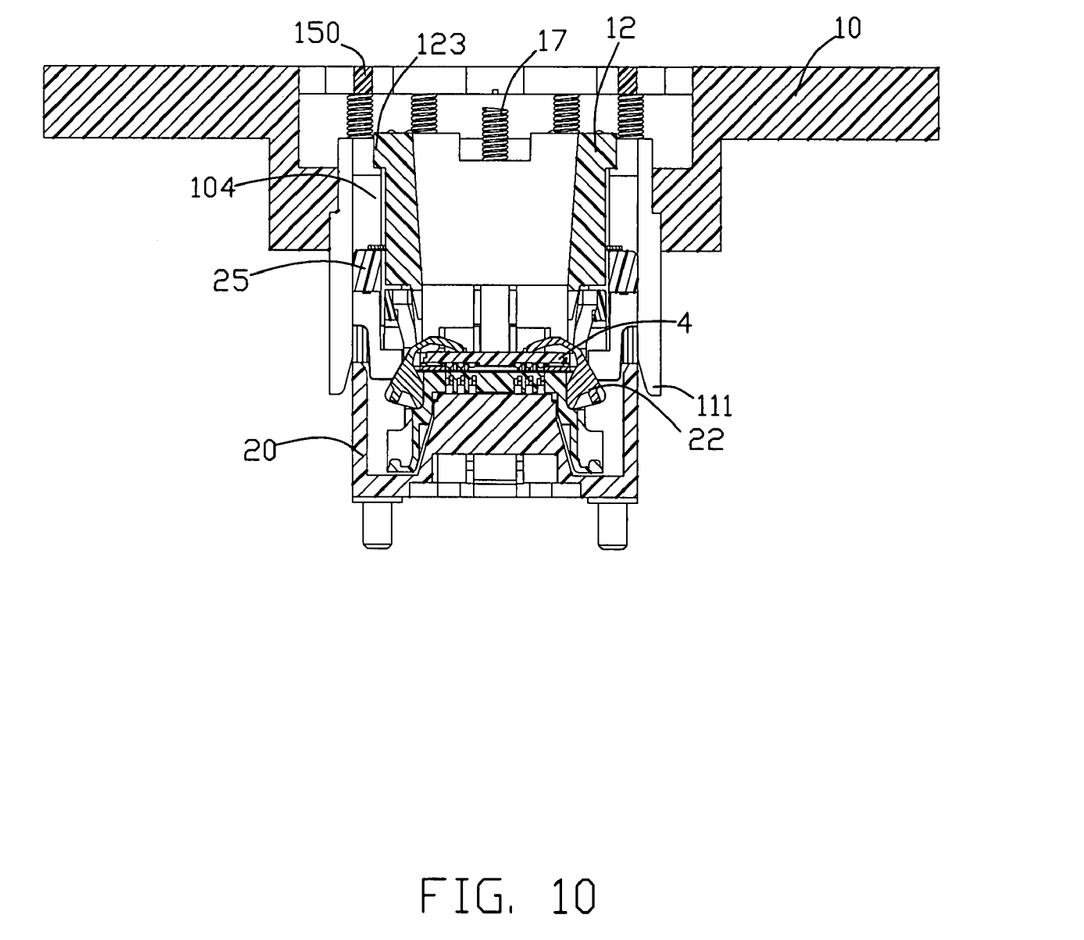
FIG. 10 is a cross sectional view taken from line 10-10 in FIG. 8, wherein a vacuum sucker in FIG. 8 is not shown.
Figure 11:
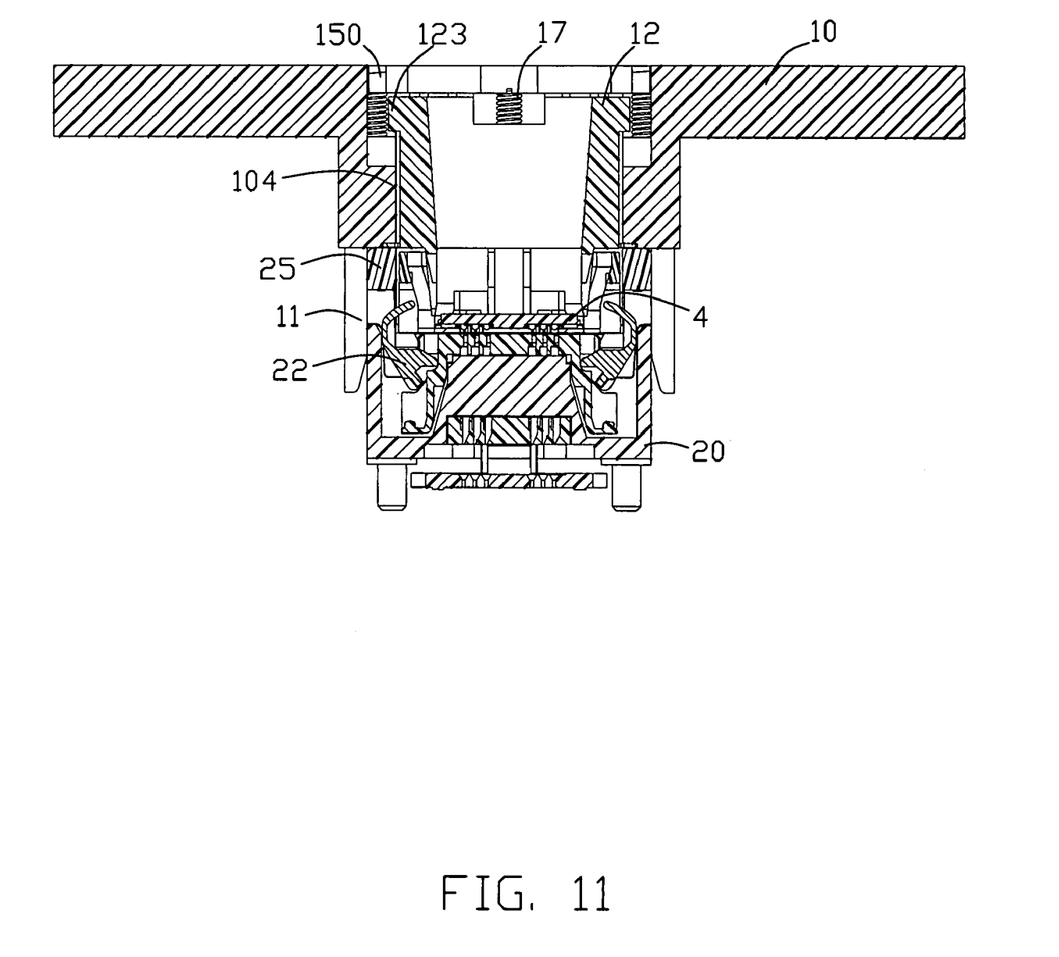
FIG. 11 is a cross sectional view taken from line 11-11 in FIG. 9, wherein a vacuum sucker in FIG. 9 is not shown.

Referring to FIG. 7, the electrical connector 2 comprises an insulating housing 20, a holding member 21 disposed upon the insulating housing 20, a locking member 22 assembled to the holding member 21, a frame 24 accepting the holding member 21 and an actuator 25 assembled to the insulating housing 20 for operating the locking member 22.

The insulating housing 20 is substantively in a long frame shape, it has engaging holes 200 on four corners thereof which are used for receiving the first springs 23. Sidewalls of the insulating housing 20 define a plurality of channels 201, the surface joint between the insulating housing 20 and the channels 201 defines protuberances 2011.

The holding member 21 is disposed on the receiving space restricted by the frame 24, then assemble the two parts onto the insulating housing 20. The holding member 21 defines a holding portion 210 supporting the semiconductor package 4, a plurality of terminals (not shown) which contact with the electric elements (not shown) of the semiconductor package are received in the holding portion 210. The holding member 21 symmetrically defines a pair of fastening portions 211 whose bottom portion is retained to the insulating housing 20, and the top portion fastens the locking portion 221 of the locking member 22. The locking member 22 contains a pair of elements and could rotate around the locking portion 221. On the opposite side of the frame 24 there defines a pair of receiving portions 240 which are passed through by the locking members 22.

The actuator 25 is in a frame shape, and has a plurality of protruding boards 250 vertically extending from circumference thereof for engaging with the channels 201, each protruding board 250 defines a tuber 2501 at the end. The actuator 25 has pins 251 on four corners and a plurality of pressure portions 252 at the opposite side. When assembly, insert the pins 251 wrapped by the first springs 23 into the holes 200, the actuator 25 assembled to the insulating housing 20 by the protuberances 2011 engaging with the tubers 2501.

In assembly, first, combines the locking members 22 with the holding member 21, and dispose the holding member 21 on the receiving space of the frame 24, wherein the locking members passing through the receiving portions 240 and retaining on the holding portion 21. Then assemble the holding member 21 with the frame 24 on the insulating housing 20, wherein the locking member 22 is at a close state at this moment. Assemble the actuator 25 to the insulating housing 20. When pressing the actuator 25, it will move downwards and the pressure portion 252 would press the locking member 22 to change the locking member 22 from the close state to the open state, at this time the semiconductor package 4 electrically contacts with the terminals (not shown) on the holding portion 210. When removing the press on the actuator 25, the locking member 22 would return to the close state and lock the semiconductor package 4. The function for the semiconductor package 4 currently electrically contacting with the terminals is completed by the tool 1 of the invention, details as follow.

Referring to FIGS. 3 to 6, the tool 1 of the invention comprises a body 10, a plurality of latching members 11 mounted on the body 10, a guiding member 12 mounted on the body 10, a plurality of ball bearings 13 received in the body 10 and the guiding member 12, a plurality of second springs 14 received in the latching members 11, a backboard 15 retained to the body 10, a sheet 16 mounted on the body 10 and the third springs 17 received in the guiding member 12.

Figure 3:
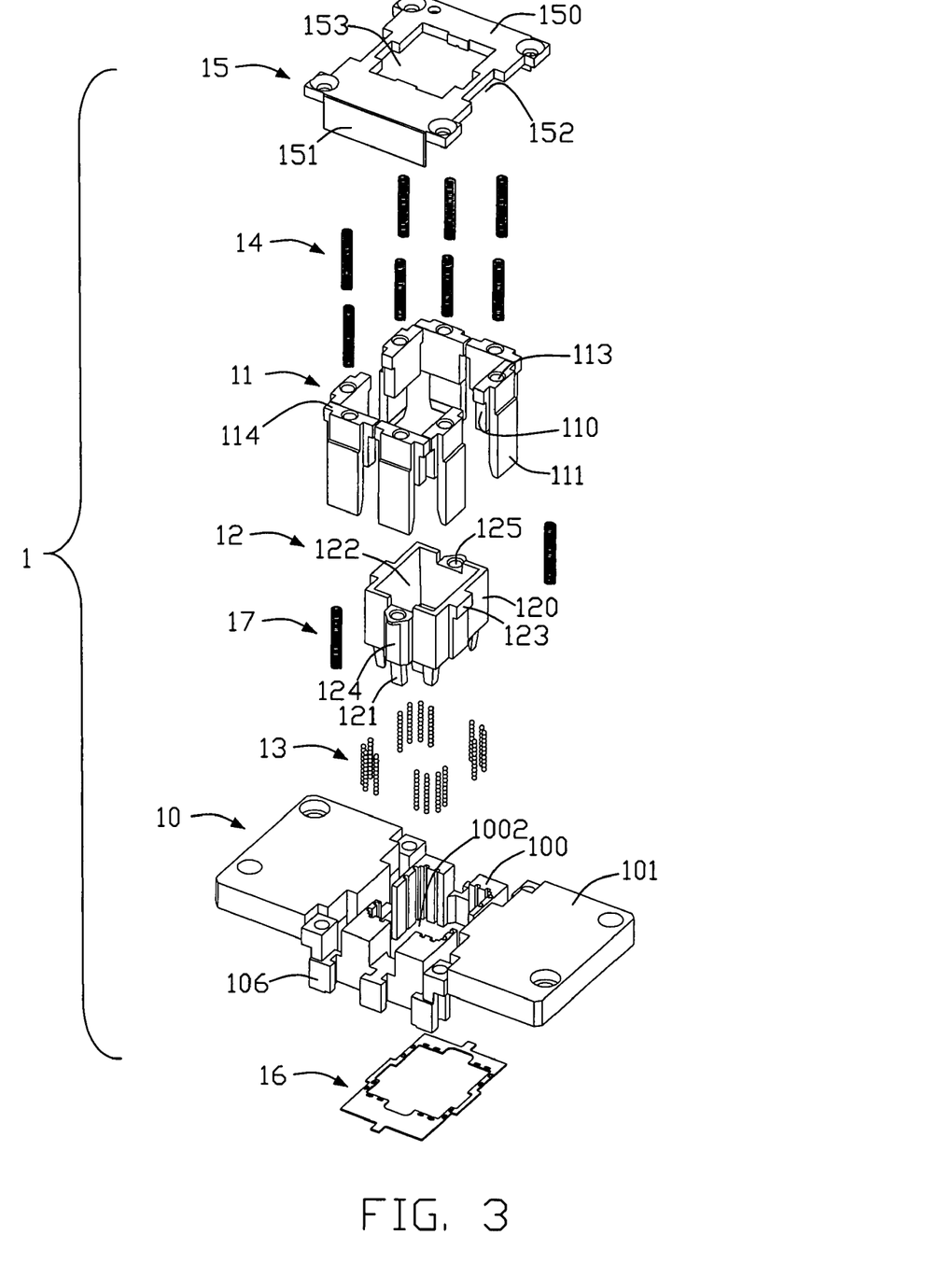
FIG. 3 is an exploded, perspective view of a tool according to a preferred embodiment of the present invention.
Figure 4:
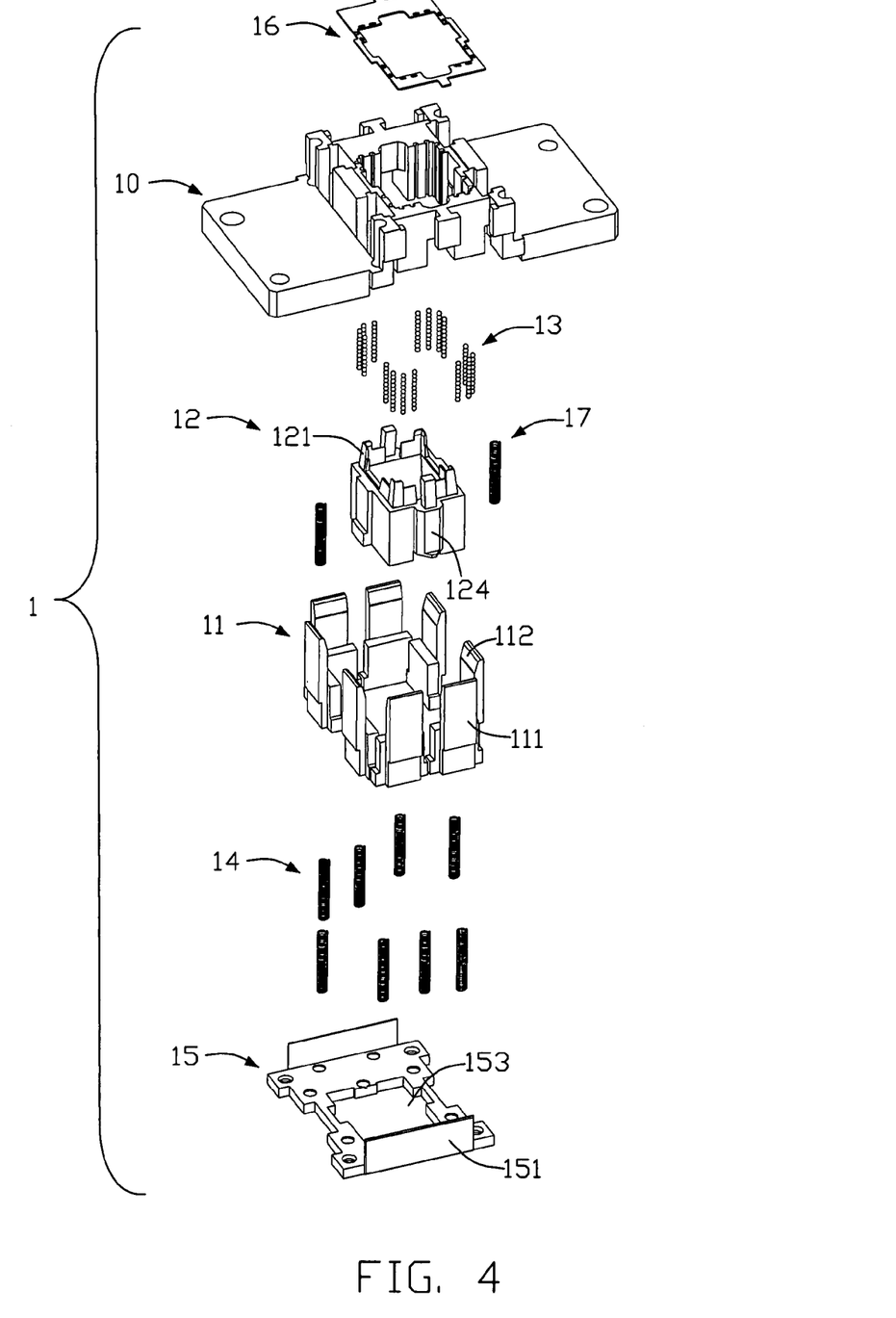
FIG. 4 is a view similar to FIG. 3, but taken from another perspective.
Figure 5:
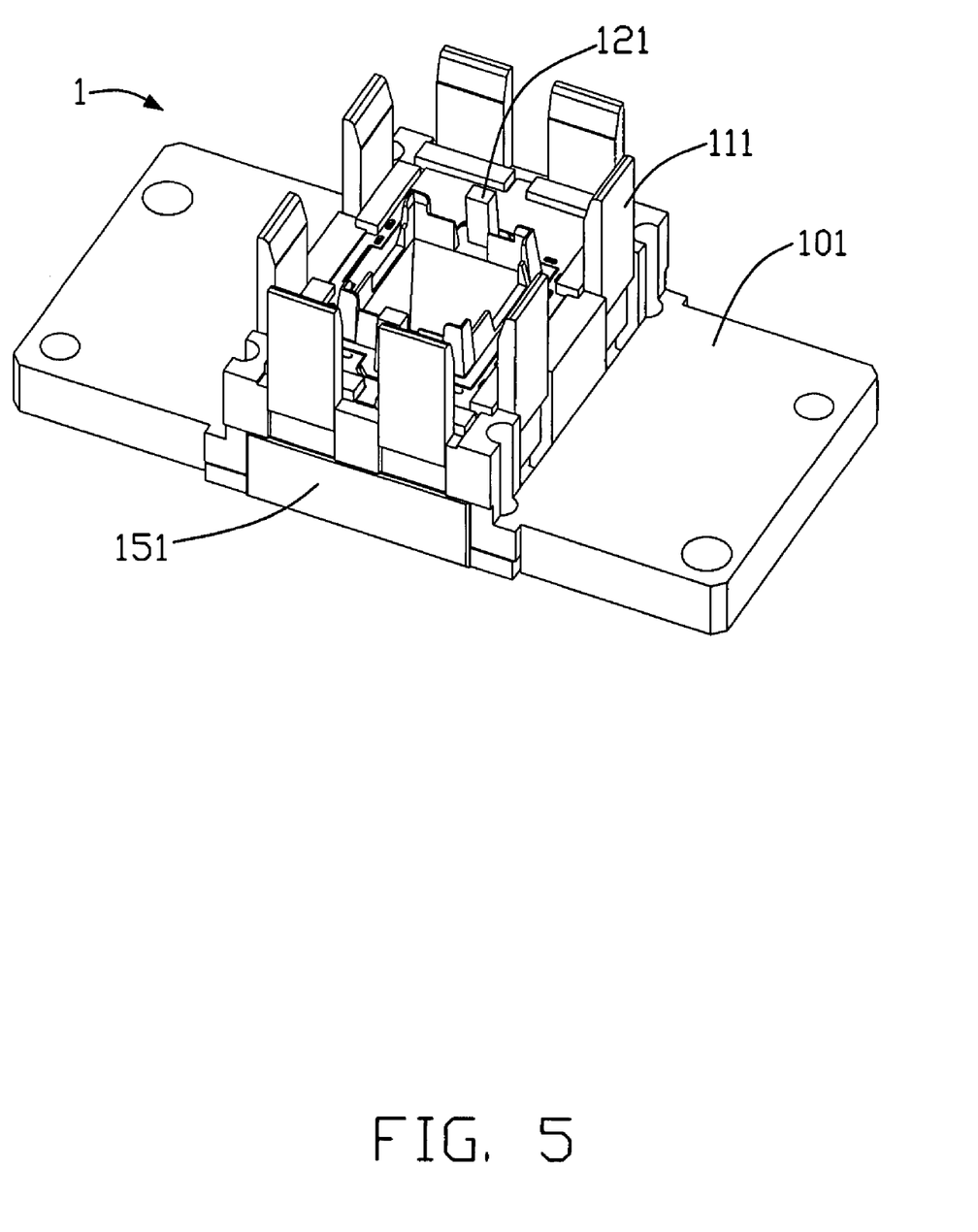
FIG. 5 is an assembled, perspective view of the tool of FIG. 4.
Figure 6:
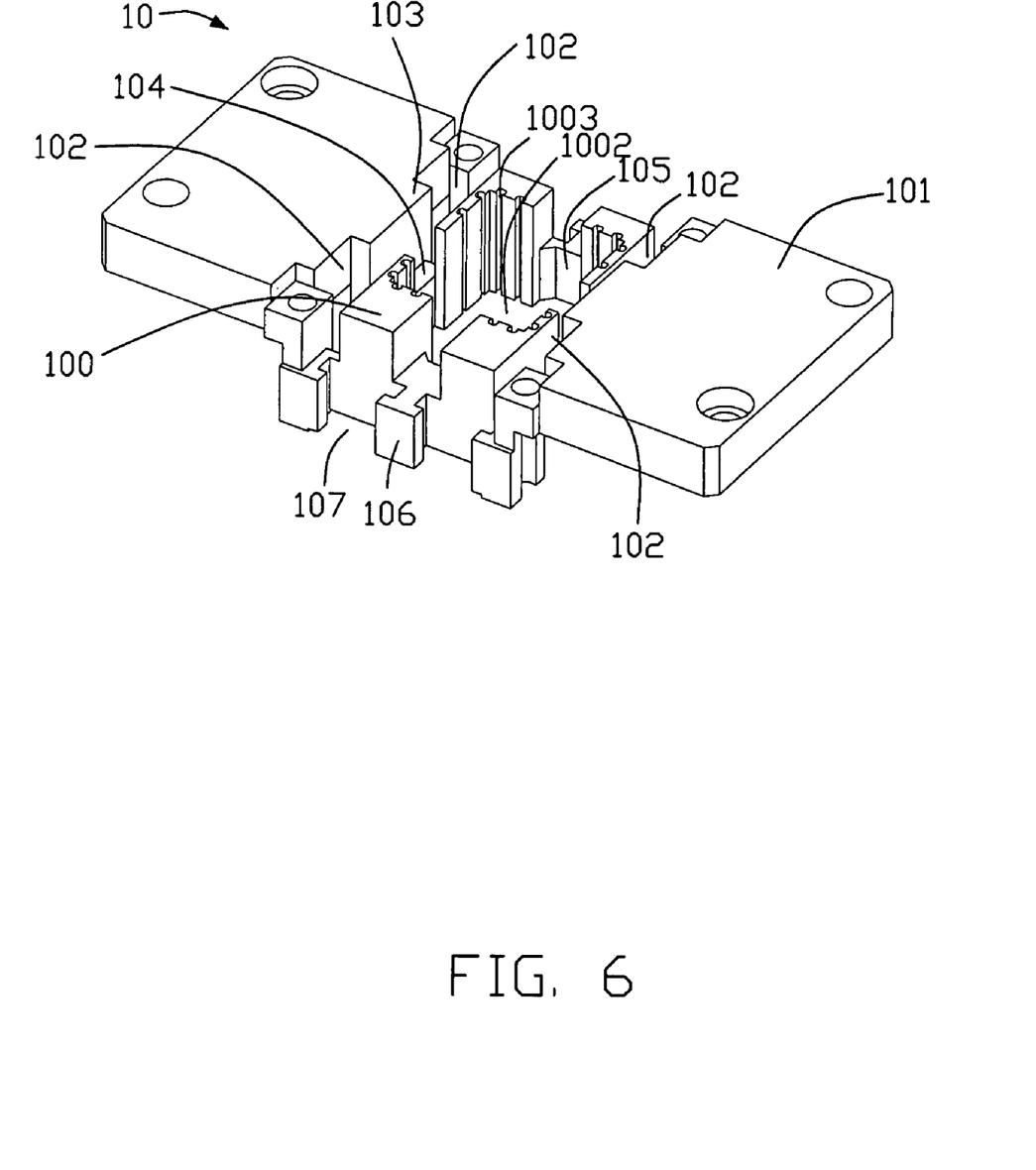
FIG. 6 is a perspective view of a body of the tool of FIG. 3.

The body 10 comprises an installing portion 100 and a pair of board-like members 101 respectively extending from opposite sides of the installing portion 100 and away from the installing portion 100. The installing portion 100 defines a center through hole 1002 which could be passed by different sides of semiconductor packages. The installing portion 100 at two sides of the through hole 1002 respectively defines two grooves 102 at the connection portion of the installing portion 100 and the board-like member 101. Between the two grooves 102 of each side there forms a guiding portion 103 from whose downside extending a positional block 104 used for engaging with the positional portion 123 of the guiding member 12. The through hole 1002 on one opposite inside walls dispose a pair of gaps (not labeled) facing rightly to the positional block 104, the gaps are used for receiving the positional portion 123 of the guiding member 12. The other opposite inside walls of the through hole 1002 respectively dispose a pair of concaves 105 mating with the gliding portion 124 of the guiding member 12. The outside walls have a plurality of projections 106, between two projections 106 forms a flute 107. Referring to FIGS. 3, 4 and 6 chiefly, the through hole 1002 defines a plurality of receiving passageways 1003 running through the top and bottom surfaces of the installing portion 100 to receive the ball bearings 13 at four corners of inside walls. After assembling the tool 1, the up and down movement of the ball bearing 13 is restricted by backboard 15 and the sheet 16. The guiding member 12 is received in the through hole 1002 and its up and down movement is restricted by the backboard 15 and positional block 104, therefore, the guiding member 12 could be floatable. Something should be pointed out is that the ball bearing 13 and the receiving passageways 1003 is unnecessary to be defined, as the guiding member 12 after assembly is also floatable without of them. If the guiding member 12 wants to glide conveniently without the ball bearing 13 and the receiving passageways 1003, it may demand a higher precision between the inside walls of the through hole 1002 and surface of the guiding member 12. There exists clearance between the guiding member 12 and through hole 1002, the dust may enter into the clearance after a period of time using, even if the dust is exiguous. The guiding member 12 will be retained in the through hole 1002 beyond returning at some serious occasions. If manufacture or other reasons result in the relatively wider clearance between the guiding member 12 and the through hole 1002, it will be possible for the guiding member 12 gliding unsuccessfully because of the asymmetric force. The convenient glide of guiding member 12 is important for solving the technical problem of the invention, the follow description will introduce ulteriorly to this point.

The latching member 11 comprises a plurality of latching components which are divided into first latching members and second latching members according to different mating forms, the two different types of latching members are installed on the different sides of the installing portion 100 respectively. Each latching member 11 comprises a longitudinal retaining portion 110 and a latching portion 111 extending from the retaining portion 110 along a vertical direction. The latching portion 111 defines an inclined plane 112 for making the tool 1 favorably latch on the electrical connector 2, the retaining portion 110 has a plurality of accepting holes 113 receiving the second springs 14 and extending portions 114 transversely extending from two ends of the retaining portion 110.

The guiding member 12 comprises a basic body 120 in a rectangular shape and a plurality of guiding ends 121 extending from the underside of the basic body 120, the guiding ends 121 extends lopsidedly towards central line of the guiding member 12. The basic body 120 defines a guiding passageway 122 which could be passed by different size of semiconductor packages, one pair of opposite sides of the basic body 120 has a pair of positional portions 123 in "L" shapes, the other pair of opposite sides of the guiding member 12 have a pair of gliding portions 124 in imperfectly cylindrical shapes, each has a receiving hole 125 on it to receive the third spring 17.

The backboard 15 comprises a flat board 150 and two arms 151 extending from two opposite sides of the flat board 150 along a vertical direction. The other two opposite sides of the flat board 150 have a pair of recessions 152 mating with the guiding portion 103 of the board-like member 101, a peristome 153 matching to the through hole 1002 of the body 10 is disposed in the center of the flat board 150.

When assembly, the latching member 11 assembled on the body 10, the first latching member is received in the groove 102 of the board-like member 101, the second latching member is received in the flutes 107, the extending portion 114 of the first latching member is disposed on the board-like member 101, the latching portion 111 extending out of the through groove 102, the extending portion 114 of the second latching member is disposed on the projections 106, the latching portion also extending out of the flute 107, the second springs 14 are put in the accepting hole 113. The ball bearings 13 are received in the receiving passageways 1003 and the guiding member 12 is received in the through hole 1002. The gliding portion 124 mates with the concaves 105 and the positional portion 123 in "L" shape mates with the gaps (not labeled). The sheet 16 is mounted on the bottom surface of the installing portion 100 to restrict the movement downwards of the ball bearings 13. The backboard 15 is retained to the body 10, the recessions 152 mates with the guiding portion 103 and the arms 151 are mounting on the opposite side of the body 10. The guiding member 12 and latching member 11 are floatable relative to the body 10 and could slid toward the backboard 15 under the external force, after removing the external force, the two members could return successfully when urged by the springs.

Referring to FIGS. 8-11, detailed description of how the tool 1 applying to the electrical connector 2 and achieving the function will be stated following. The latching member 11 is retained to the outside of the actuator 25 to assemble the tool 1 on the electrical connector 2, the latching member 11 is difficult to be damaged while operating as it is floatable. The electrical connector 2 and the locking member 22 are at closed status when the tool 1 has not put pressure on the electrical connector 2 yet. Once a pressure is placed on the backboard 15 of the tool 1, the installing portion 100 will transmit the force to the actuator 25 of the electrical connector 2, the status of the locking member 22 will change from closed to open under the pressure of the actuator 25. At this moment, the semiconductor package 4 is sucked by the vacuum sucker 3 to passes through the through hole 1002 of the body 10 and the guiding passageway 122 of the guiding member 12, then it will be released by operating the vacuum sucker 3, and it will get to expected position successfully by the restriction of the guiding ends 121 of the guiding member 12 to accurately contact with the terminals in the holding portion 210. Removing the pressure on the tool 1, the locking member 22 returns to the closed status to lock up the semiconductor package 4.

After completing the test of the former semiconductor package, it needs to be fetched out from the electrical connector 2. Similarly, the tool 1 is assembled on the electrical connector 2, and place a pressure on the tool 1. The guiding ends 121 of the guiding member 12 has already covered around the semiconductor package 4 before the locking member 22 turning to the open status, and the locking member 22 would turn open by continuing to press the tool 1. At this moment, the semiconductor package 4 could be taken out conveniently, although the semiconductor package 4 departs from the initial position accidentally, it will not depart from the area restricted by the guiding ends 121. When loading the semiconductor, it may depart from the area restricted by the guiding ends 121 because of the inexact manufacture and assembly of the guiding member 12, the semiconductor package 4 would come up against the guiding end 121, however the operator could discover the problem at once to decrease and avoid the damage of semiconductor package 4 since the guiding member 12 could float upwards easily.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A combination tool and electrical connector for assembling semiconductor package comprising:
   the assembly tool operatively associated with the electrical connector, said electrical connector including a plurality of terminals for electrically contacting with the semiconductor package;
   the assembly tool located upon the electrical connector and comprising a body with a through hole, and a guiding member received in the through hole, the guiding member defining a guiding passageway passing through upper and bottom faces of the guiding member for guiding the semiconductor package to accurately electrically contact with the terminals of the electrical connector;
   wherein the guiding member moves up and down relative to the body when the semiconductor package is removed from or loaded in the electrical connector;
   the tool has a plurality of latching members, each has a latching portion for retaining the tool to the electrical connector;
   wherein the body comprises an installing portion and two board members extending from two opposite sides of the installing portion.

2. A combination tool and electrical connector for assembling semiconductor package comprising:
   the assembly tool operatively associated with the electrical connector, said electrical connector including a plurality of terminals for electrically contacting with the semiconductor package;
   the assembly tool located upon the electrical connector and comprising a body with a through hole, and a guiding member received in the through hole, the guiding member defining a guiding passageway passing through upper and bottom faces of the guiding member for guiding the semiconductor package to accurately electrically contact with the terminals of the electrical connector;
   wherein the guiding member moves up and down relative to the body when the semiconductor package is removed from or loaded in the electrical connector;
   the tool has a plurality of latching members, each has a latching portion for retaining the tool to the electrical connector;
   wherein the tool has a backboard assembled upon the body of the tool, the backboard defines a peristome with the same size with the through hole of the body and is used to be pressed to bring the tool moving downwardly.

3. A combination tool and electrical connector for assembling semiconductor package, the combination comprising:
   the electrical connector comprising a plurality of terminals for electrically contacting with the semiconductor package and a locking member for locking the semiconductor package in the electrical connector;
   the assembly tool located upon the electrical connector and comprising a body with a through hole and a guiding member received in the through hole, the guiding member defining a guiding passageway passing through upper and bottom faces of the guiding member for guiding the semiconductor package to accurately electrically contact with the terminals of the electrical connector;
   wherein the guiding member comprising a plurality of guiding ends extending downward against the locking member of the electrical connector so as to actuate the locking member from a closed position to an opening position to allow the semiconductor package to remove from or load in the electrical connector;
   wherein the guiding ends extend towards a central line of the guiding member.

* * * * *